United States Patent
Shimizu et al.

[11] Patent Number: 5,905,547
[45] Date of Patent: May 18, 1999

[54] INFORMATION RECORDING MEDIUM AND INFORMATION RECORDING APPARATUS

[75] Inventors: Osamu Shimizu; Hironori Kamiyama; Shyouji Takeshige, all of Tokyo, Japan

[73] Assignee: DAI Nippon Printing Co., Ltd., Tokyo, Japan

[21] Appl. No.: 08/686,867

[22] Filed: Aug. 1, 1996

[30] Foreign Application Priority Data

Aug. 2, 1995 [JP] Japan .................................. 7-197637

[51] Int. Cl.⁶ .............................. G02F 1/13; G02F 1/135
[52] U.S. Cl. .................................. 349/2; 349/25
[58] Field of Search .................... 349/2, 24, 25

[56] References Cited

U.S. PATENT DOCUMENTS

| | | | |
|---|---|---|---|
| 3,971,931 | 7/1976 | Jehle | 349/25 |
| 4,048,628 | 9/1977 | Boswell | 349/25 |
| 4,688,900 | 8/1987 | Doane et al. | 350/347 V |
| 4,842,379 | 6/1989 | Oishi | 349/33 |
| 5,085,498 | 2/1992 | Yamamoto | 349/25 |
| 5,313,288 | 5/1994 | Takanashi | 349/25 |
| 5,315,410 | 5/1994 | Takanashi | 349/25 |
| 5,317,345 | 5/1994 | Ueki | 349/22 |
| 5,646,927 | 7/1997 | Shimizu | 7/97 |

*Primary Examiner*—Tiep H. Nguyen
*Attorney, Agent, or Firm*—Sughrue, Mion, Zinn, Macpeak & Seas, PLLC

[57] ABSTRACT

The present invention provides an information recording medium having a liquid crystal phase, which can be repeatedly used. In an information recording medium where an information recording layer comprising a liquid crystal phase and a resin phase is laminated on an electrode, a mixture containing a smectic liquid crystal having good memory property and a liquid crystal having low memory property is used as the liquid crystal phase, the information recorded on the liquid crystal disappears as time elapses without being heated and the information recording medium can be repeatedly used for further information recording.

17 Claims, 2 Drawing Sheets

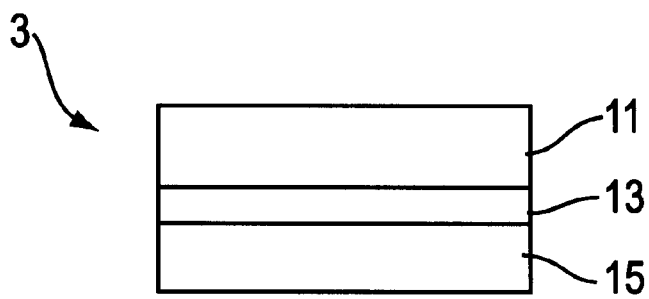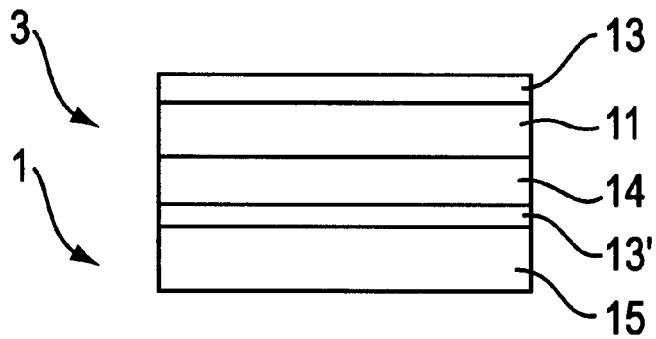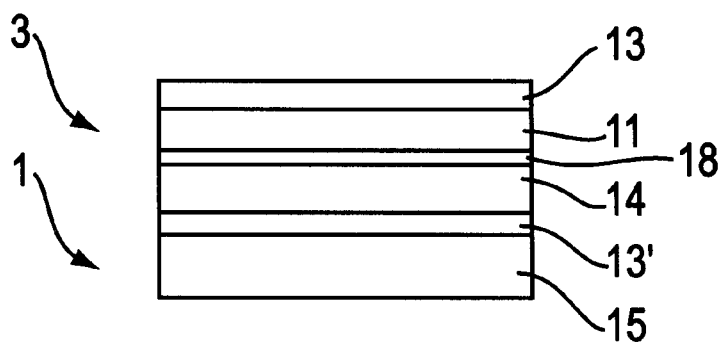

INFORMATION RECORDING MEDIUM AND INFORMATION RECORDING APPARATUS

BACKGROUND OF THE INVENTION

The present invention relates to an information recording medium comprising an information recording layer, which has a liquid crystal phase and a resin phase, and in particular to an information recording medium, in which information recorded on the information recording medium can be easily erased and the same information recording medium can be repeatedly used. The invention also relates to an information recording apparatus using such an information recording medium.

The present applicants have previously proposed an information recording medium, and an information recording apparatus and an information recording method using said information recording medium in Japanese Patent Publications Laid-Open 5-165005 and 6-130347. This information recording medium in the previous applications has an information recording layer laminated on an electrode, said information recording layer is formed by a polymer dispersion type liquid crystal, which comprises a resin phase and a liquid crystal phase. Using a UV-setting resin as the resin phase of the information recording layer, the UV-setting resin particles are filled and dispersed in the liquid crystal phase and surface of the information recording layer is used as a skin layer of the UV-setting resin. The invention also provides an information recording apparatus and an information recording method, in which said information recording medium is placed face-to-face to an optical sensor having a photoconductive layer laminated on an electrode, and by image exposure and voltage application, an image is formed on the information recording medium.

Further, to reproduce the recorded information after information has been recorded, an information recording apparatus having an information reproducing unit on it was also filed as Japanese Patent Application 6-119053. Also, an information recording apparatus having a mechanism to erase the recorded information by heating has been proposed.

In the information recording layer as described above, the surface is formed by a resin layer only. As a result, no bleeding phenomenon of the liquid crystal occurs, and noiseless recording can be performed in the information recording using a photoelectric sensor. Because this information recording layer retains the recorded information after the voltage applied on the electrode has been removed, the liquid crystal phase contains liquid crystal with smectic property to a great extent, and an information recording medium having an information recording layer to stably maintain the recorded information has been used. Taking an example, a liquid crystal mixture is used, which contains a liquid crystal having nematic property and a liquid crystal having smectic property in mixing ratio of 5/95–20/80.

However, strong memory property is generated and continuously retained unless it is heated above the isotropic phase transition temperature, and it is necessary to heat to higher than the isotropic phase transition temperature in order to erase the recorded information and to repeatedly utilize the same information recording medium. For this reason, in an information recording apparatus using the above information recording medium, it is necessary to provide a heating mechanism, which can heat the information recording medium sufficiently to erase the recorded information because the information recording medium has strong memory property and the information recording medium is repeatedly used by erasing the recorded information.

It is an object of the present invention to provide an information recording medium, by which it is possible to record information by an electrode laminated on an information recording layer by information exposure, to easily erase the recorded information, and to repeatedly use it as the information recording medium.

SUMMARY OF THE INVENTION

The information recording medium according to the present invention comprises an information recording layer laminated on an electrode, said information recording layer containing a liquid crystal phase for recording information along an orientation of the liquid crystal, the recorded information disappearing as time elapses without being heated, and the liquid phase where the information was recorded can be repeatedly used for further information recording.

The present invention also provides an information recording medium as described above, wherein the information recording layer is obtained by UV-setting of a composition, which contains at least a UV-setting prepolymer, a liquid crystal and a surface active agent.

The invention also provides an information recording medium as described above, wherein the resin phase constituting the information recording layer comprises a UV-setting resin, and surface layer of the information recording layer comprises a skin layer of UV-setting resin only.

The present invention also provides an information recording medium as described above, wherein the liquid crystal constituting the information recording layer comprises a liquid crystal phase and a resin phase and contains a mixed crystal having a liquid crystal with nematic property and a liquid crystal with smectic property in mixed weight ratio of 95/5–30/70.

The present invention also provides an information recording apparatus for recording optical information to an information recording medium by information exposure, wherein a photoelectric sensor having a photoconductive layer formed on an electrode and said information recording medium are connected to each other on an optical axis with a gap therebetween.

The present invention provides an information recording apparatus as described above, wherein the photoelectric sensor has photo-induced current amplifying effect.

The present invention provides an information recording apparatus as described above, wherein an information reproducing unit is provided.

The present invention also provides an information recording apparatus as described above, wherein, after information has been recorded, the information reproducing process is repeatedly performed.

The present invention also provides an information recording apparatus, comprising a photoconductive layer, a dielectric layer, an information recording layer and an upper electrode laminated sequentially in this order on a lower electrode, whereby the information recording layer comprises said information recording layer, and the lower electrode and the upper electrode are connected to each other so that voltage can be applied.

The invention also provides an information recording apparatus for recording optical information to an information recording medium by information exposure, wherein a component element comprising the lower electrode and the photoconductive layer has photo-induced current amplifying effect.

BRIEF DESCRIPTION OF THE DRAWINGS

FIGS. 1(a), (b) and (c) are cross-sectional views for explaining an information recording medium according to the present invention;

DESCRIPTION OF THE PREFERRED EMBODIMENT

Figure 2:
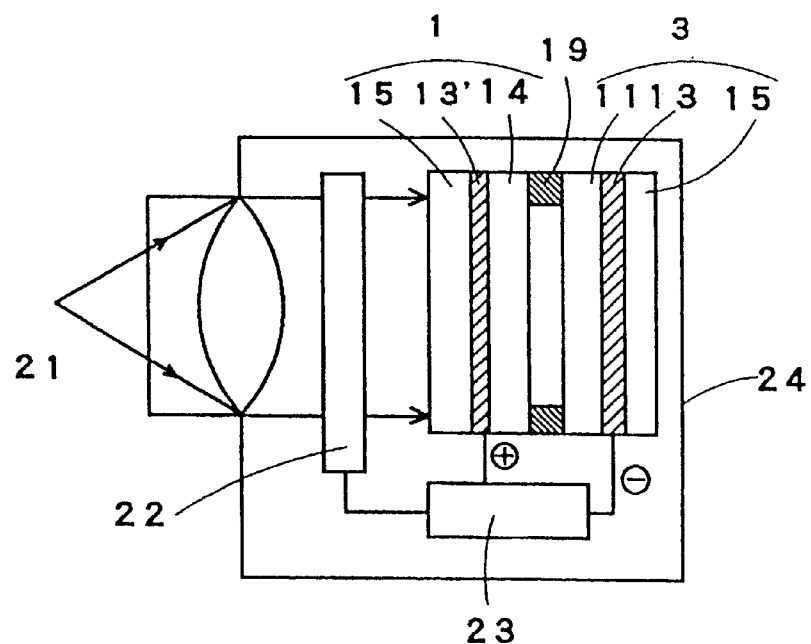
FIG. 2 is a drawing for explaining an information recording method to the information recording medium of the present invention.

A first example of the information recording medium of the present invention is shown in FIG. 1 (a) as a cross-sectional view. An information recording medium 3 shown in FIG. 1 (a) is an information recording medium, which is used for information exposure by placing it face-to-face to a photoelectric sensor and has an information recording layer 11 on a lower electrode 13 formed on a substrate 15.

The photoelectric sensor used together with the information recording medium of the present invention comprises a photoconductive layer where optical carriers (electrons and holes) are generated on an irradiated portion when light is irradiated on it.

The photoconductive layer may comprise a single layer containing both a charge generating material and a charge transport material, or it may comprise a charge generating layer and a charge transport layer laminated on each other.

In case the photoelectric sensor comprises two layers, i.e. a charge generating layer and a charge transport layer, the charge generating layer is formed by a binder resin and a charge generating material. As the charge generating materials, there are photoconductive substances including pigments and dyes such as quinone type pigment, azo type pigment, bisazo type pigment, trisazo type pigment, phthalocyanine type pigment, acidic xanthene type dye, cyanine type dye, styril type dye, pyrylium type dye, perylene type dye, methine type dye, azulenium salt type dye, squalium salt type dye, etc., or inorganic substances such as a-selenium, a-silicon, etc. These substances may be used alone or in combination.

As the binder resin used in the charge generating layer, there are, for example, silicone resin, polycarbonate resin, vinylformal resin, vinylacetal resin, vinylbutyral resin, styrene resin, styrene-butadiene copolymer resin, epoxy resin, acrylic resin, saturated or unsaturated polyester resin, methacrylic resin, vinyl chloride resin, vinyl acetate resin, vinyl chloride-vinyl acetate copolymer resin, etc. These binder resins may be used alone or in combination.

The mixing ratio of the charge generating agent and the binder resin is preferably 0.1 to 10 weight parts of the binder, or more preferably 0.2 to 1 weight part to 1 weight part of the charge generating agent.

An electron accepting substance may be added to the charge generating layer. As the electron accepting substances, there are 2,4,7-trinitrofluorenone, tetrafluoro-P-benzoquinone, tetracyanoquinodimethane, triphenylmethane, maleic acid anhydride, hexacyanobutadiene, etc.

To form the charge generating layer, the above binder resin, the charge generating substance, and the electron accepting substance are dissolved or dispersed in a solvent, and this is coated on an electrode and is dried. As the solvent, dichloroethane, 1,1,2-trichloroethane, monochlorobenzene, tetrahydrofuran, cyclohexane, dioxane, 1,2,3-trichloropropane, ethylcellosolve, 1,1,1-trichloroethane, methylethylketone, chloroform, toluene, etc. For coating, blade coating method, immersion method, spin coating method, etc. may be used. The charge generating layer has preferably a thickness of 0.01 to 1 µm, or more preferably 0.1 to 0.3 µm after it is dried.

Of the charge generating substances, those can be formed in film by vacuum deposition method may be formed alone in film without using the binder resin.

The charge transport layer comprises a binder resin and a charge transport substance. The charge transport substance is a substance, which has the property to transport the electric charge in the charge generating layer while voltage is being applied. These substances are, for example, polycyclic aromatic compounds of hydrazone type, pyrazoline type, styril type, stilbene type, butadiene type, azine type, enamine type, azole type, polyvinylcarbazole type, carbazole type, oxazole type, triazole type, aromatic amine type, amine type, and triphenylmethane type. The substances of hole transport property or electron transport property may be used.

As the binder resin, those used for formation of the charge generating layer may be used. For example, there are silicone resin, styrene-butadiene copolymer resin, epoxy resin, acrylic resin, saturated or unsaturated polyester resin, polycarbonate resin, polyvinyl acetal resin, phenol resin, methyl polymethacrylate resin, melamine resin, polyimide resin, vinyl chloride resin, vinyl acetate resin, etc. This may be used by 0.05 to 1 weight part to 1 weight part of the charge transport substance. The binder resin is required in case the charge transport substance plays a role as a binder.

In the charge transport layer, the electron accepting substance as used for the charge generating layer may be blended by 0.001 to 10 weight parts to 1 weight part of the charge transport substance. To obtain the charge transport layer, the charge transport substance, the binder resin, and the electron accepting substance are dissolved or dispersed in a solvent as described for the charge generating layer, and it is coated on the charge generating layer by the same coating method and is dried to have the film thickness of 1 to 50 µm.

The information recording layer 11 comprises a liquid crystal phase and a resin phase. As the material of liquid crystal, a mixture of smectic liquid crystal and nematic liquid crystal, or a mixture of smectic liquid crystal, cholesteric liquid crystal and nematic liquid crystal may be used. The smectic liquid crystal has an effect to retain orientation property of liquid crystal for short time, and this provides the liquid crystal with memory property to retain information. Information retaining time can be determined by the blending ratio of this substance. To have longer information retaining time, it is recommended to increase the ratio of the smectic liquid crystal. To have shorter retaining time, it is recommended to decrease the blending ratio of the smectic liquid crystal.

In case a mixture of smectic liquid crystal and nematic liquid crystal is used, from the viewpoints of information retaining property and information erasing property, the blending ratio of nematic liquid crystal and smectic liquid crystal is preferably 30/70 95/5, or more preferably 40/60–90/10, or most preferably 50/50–80/20. If the ratio of smectic liquid crystal is too low, an information retaining time long enough for reading cannot be obtained. If the ratio of smectic liquid is too high, the memory property becomes too strong, and information cannot be erased within a given time. The time to erase information in the information recording medium varies according to the mode of utilization of the information recording medium. By the use of the liquid crystal in the above ratio, the information retaining time can be determined between 3 minutes and 48 hours. The time period in this range is preferable for repeated use of the medium by erasing the information as time elapses.

As the smectic liquid crystal, there are liquid crystal materials showing smectic A phase such as cyanobiphenyl type cyanoterphenyl type, phenylester type, and fluorine type, having long carbon chain at terminal group of the liquid crystal material, or liquid crystal materials showing smectic C phase used as ferroelectric liquid crystal, or liquid crystal material showing smectic H, G, E, F, etc. The liquid crystal composition having apparent smectic property may be used. As the nematic liquid crystal, there are, for example, nematic liquid crystal material already known which can be used such as Schiff base type, azoxy type, azo type, benzoic acid phenyl ester type, cyclohexylic acid phenylester type, biphenyl type, terphenyl type, phenyl-cyclohexane type, phenylpyridine type, phenyloxazine type, polycyclic ethane type, phenylcyclohexene type, cyclohexyl-pyrimidine type, phenyl type, tolane type, etc., etc. A liquid crystal composition having apparent nematic property may also be used.

As the cholesteric liquid crystal, halogenated compound, esterified compound, carbonate ester, etc. of cholesterol having cholesteric liquid crystal property may be used.

As the liquid crystal, it is preferable to use a material having high anisotropic property of refractive index. The material having higher anisotropic property is preferable because an image with higher contrast can be recorded.

As the UV-setting prepolymer, it is preferable to use those having compatibility with liquid crystal material in the state of monomer or oligomer, or those having common compatibility with the liquid crystal material in the state of monomer or oligomer. For example, acrylic acid ester, methacrylic acid ester, etc. can be used. As monomer and oligomer, multifunctional monomers such as dipentaerythritolhexaacrylate, trimethyrolpropane triacrylate, polyethyleneglycol diacrylate, polypropyleneglycol diacrylate, isocyanuric acid (ethyleneoxide denatured) triacrylate, dipentaerythritol pentaacrylate, dipentaerythritol tetraacrylate, neopentylglycol diacrylate, hexanediol diacrylate, etc. or polyfunctional urethane type or ester type oligomer, and further, monofunctional monomer or oligomer such as nonylphenol denatured acrylate, N-vinyl-2-pyrolidone, 2-hydroxy-3-phenoxypropyl acrylate, etc. may be used. It is preferable to use a multifunctional, non-cured UV-setting prepolymer having a parameter expressed by average molecular weight/average functional groups being 160 or less. Then, it is possible to have a resin layer with high durability formed on the surface of the information recording layer. Even when the ratio of the liquid crystal in the information recording layer is increased, no bleeding of liquid crystal occurs to the surface of the information recording layer, and this eliminates disturbance of the image and provides an image of high quality.

The ratio of the liquid crystal material and the UV-setting prepolymer is preferably 10 to 90 weight % of the liquid crystal to total quantity of the liquid crystal material and the UV-setting prepolymer, or more preferably 40 to 80 weight %. If it is less than 10 weight %, light transmittance is low even when liquid crystal phase is oriented in information recording. If it is more than 90 weight %, bleeding of the liquid crystal may occur and the image may become uneven.

Because the liquid crystal and the UV-setting resin are used in the information recording layer of the present invention, more liquid crystal can be contained in the information recording medium. This makes it possible to increase the contrast ratio and to decrease operating voltage.

In the information recording layer, if the optical refractive index of the liquid crystal phase is approximately equalized with optical refractive index of the resin phase, it is non-transparent due to scattering of the light when voltage is not applied. When voltage is applied, the liquid crystal phase is oriented and the information recording portion can be turned to transparent. A polarizing plate is not required for reproducing the information, and the optical system for reading can be simplified.

In the mixture solution for forming the information recording layer, a fluorine type surface active agent is added for the purposes of improving the wetting property to the electrode layer, to increase coating property of the mixture solution, to have better surface quality, and to form a skin layer, containing only resin, on the surface of the information recording layer when curing. As the fluorine type surface active agents, the following substances may be used: For example, Florade FC-430, Florade FC-431 [manufactured by Sumitomo 3M Co.], N-(n-propyl)-N-(β-acryl-oxyethyl)-perfluorooctylsulfonic acid amide [EF-125M; Mitsubishi Material], N-(β-methacryloxyethyl)-perfluorooctylsulfonic acid amide [EF-125M; Mitsubishi Material], N-(n-propyl)-N(β-methacryloxyethyl)- perfluorooctane sufonic acid amide [EF-135M; Mitsubishi Material], perfluorooctane sulfonic acid [EF-101; Mitsubishi Material], perfluoro-caprylic acid [EF-201; Mitsubishi Material], N-(n-propyl)-N-perfluorooctane sultonic acid amide ethanol [EF-121; Mitsubishi Material], and further, EF series products of Mitsubishi Material such as EF-102, 103, 104, 105, 112, 121, 122A, 122B, 122C, 122A3, 123B, 132, 301, 303, 305, 306A, 501, 700, 201, 204, 351, 352, 801, 802, 125D5, 1200, L102, −L155, L174, L215, etc. Also, the following materials may be used: 3-(2-perfluorohexyl) ethoxy-1, 2-dihydroxypropane [MF-100; Mitsubishi Material], N-n-2,3-dihydroxypropyl-perfluorooctyl sufonamide [MF-110; Mitsubishi Material], 3-(2-perfluorohexyl) ethoxy-1, 2-epoxypropane [MF-120; Mitsubishi Material], N-n-propyl-N-2,3-epoxypropyl-perfluorooctylsulfonamide [MF-130; Mitsubishi Material], perfluorooctylsulfonamide [MF-140; Mitsubishi Material], N-[(3-trimethoxysilyl) propyl]-perfluoropeptyl carboxylic acid amide [MF-150; Mitsubishi Material], N-[(3-trimethoxysilyl) propyl]-perfluoroheptylsulfonamide [MF-160; Mitsubishi Material], etc. may be used. The fluorine type surface active agent is used in the ratio of 0.1 to 20 weight % to total quantity of liquid crystal and resin forming material.

As the mixture solution containing the liquid crystal, the UV-setting prepolymer and the fluorine type surface active agent in the present invention, liquid crystal, UV-setting prepolymer and fluorine type surface active agent are dissolved in a common solvent and used. The solvent is preferably used to form the information recording layer in thin film. As such a solvent, it is preferable to use a solvent having relative evaporation rate R of smaller than 2 to acetic acid-n-butyl.

The relative evaporation rate indicates volatility at a given temperature and it is measured at 20° C. It is given by the following formula:

$$\text{Relative evaporation rate } (R) = \frac{\text{Time required for evaporation of acetic acid-n-butyl}}{\text{Time required for evaporation of the solvent under test}}$$

Taking an example, it is preferable to use the substance having a relatively slow evaporation rate such as xylene (R=0.76), cyclohexanone (R=0.32), or halogenated hydrocarbon type solvent represented by chloroform, or alcohol derivative type solvent represented by methyl-cellosolve, or ether type solvent represented by dioxane may be used. Further, there are methanol, ethanol, isopropanol, n-butanol, methylisobutylcarbinol, diisobutylcarbinol hexyleneglycol, acetic acid-n-butyl, methyl acetate amyl, amyl acetate (95% isomer mixture), ethyl lactate, methyloxytol, ethyloxytol, isopropyloxytol, methyloxytol acetate, ethyloxytol acetate butyloxytol, butyldioxytol, butyldioxytol acetate, methylisobutyl-ketone, ethylamyl-ketone, methylcyclohexanone, diisobutylketone, diacetone alcohol, isophorone, 1, 4-dioxane, perchloroethylene, dichloropropane, 2-nitropropane, toluene, etc.

Further, a light curing agent is added to the liquid crystal and the IN-setting prepolymer. As the light curing agent, one type or two types or more of the following substances may be used: 2-hydroxy-2-methyl-1-phenylpropane-1-one (Dalocure 1173; Ciba-Geigy) 1-hydroxycyclohexyl-phenylketone (Irugacure 184; Ciba-Geigy), 1-(4-sopropylphenyl)-2-methylpropane-one (Dalocure 1116; Ciba-Geigy), benzyldimethylketal (Irugacure 651; Ciba-Geigy), 2-methyl-1-[4-(methylmeo)phenyl]-2-morpholinopropanone-1 (Irugacure 907; Ciba-Geigy), 2, 4-diethylthioxanthone (Kayacure DETX; Nippon Kayaku Co.), p-dimethylamine benzoic acid ethyl (Kayacure EPA; Nippon Kayaku), isopropylthioxanthone (Kuntacure ITX; Ward Breckinthop). In particular, it is preferable to use 2-hydroxy-2-methyl-1-phenylpropane-1-one in liquid state in view of compatibility with liquid crystal material and IN-setting prepolymer.

Next, a description will be given on the method to form the information recording layer.

(1) Liquid crystal, IN-setting prepolymer, photo-polymerization initiator and fluorine-type surface active agent are dissolved in a solvent, which has a relative evaporation rate to acetic acid-n-butyl of lower than 2 to obtain a mixture solution, which has solid matter concentration of 10 to 60 weight %. It is preferable that the viscosity of the solution diluted by the solvent is 1 to 500 cTs (20° C.) If the viscosity is too low, the coated solution flows away, and the film thickness after coating cannot be maintained. If the viscosity is too high, it is difficult to have uniform thickness. If gelated product of UV-setting prepolymer, dust, etc. are present in the coating solution, noise occurs in the information recording medium, and it is necessary to remove them from the coating solution.

(2) The coating solution is coated using a spin coater, a bar coater, a blade coater or a roll coater to have uniform film thickness. If the solvent is evaporated and dried in the stage to adjust the mixture solution, phase separation occurs, and a uniform coating film cannot be obtained. For this reason, it is desirable to use a solvent having a relative evaporation rate to acetic acid-n-butyl lower than 2 as described above. If the relative evaporation rate is higher than 2, evaporation occurs too quickly, and the above problem arises. If dissolution occurs by heating of up to 70° C., no problem arises when R of the solvent is more than 0.3 and less than 1, and xylene (R=0.7) may be used. If heating up to 70° C. or higher temperature is needed for dissolving, a solvent with R less than 0.3, e.g. cyclohexanone (R=0.2), may be used as the solvent.

(3) The coated layer is dried, and the solvent is evaporated and removed. The drying process may be performed in the temperature range: isotropic phase transition temperature ±10° C. By carrying out the drying process and the curing process within this temperature range, it is possible to provide smoothness on the surface of the information recording layer and uniformity of film thickness, and also to separate the information recording layer to liquid crystal phase and resin phase and to obtain a structure suitable for information recording.

(4) The coating layer of the mixture solution is irradiated with ultraviolet ray and is cured in the same temperature range as the drying process, using an ultraviolet ray lamp immediately after the drying process. In irradiating an ultraviolet ray to the coating layer, the ultraviolet ray having components with a wavelength of 200 to 400 nm by 1% is used, and when it is irradiated with energy of 0.1 mJ/cm² or more, the information recording layer separated into a liquid crystal phase and a resin phase, is obtained. A skin layer with thickness of about 0.6 μm is formed on the surface of the information recording layer, and uniform resin particles with primary particle size of 0.03 to 0.3 μm are filled in the information recording layer with the liquid crystal phase communicating between them. In microstructure in the information recording layer, if phase separation to a liquid crystal phase and resin phase is incomplete, good contrast cannot be obtained, and the information recording layer itself is turned to low resistance. When information recording is performed using a photoelectric sensor on such an information recording medium, effective voltage is not applied on the liquid crystal phase, and the liquid crystal acts slow, resulting in the information recording medium with lower sensitivity.

(5) It is preferable that the curing temperature of the coating layer is within ±10° C. of "compatibility temperature—non-compatibility temperature" or "compatibility temperature—liquid crystal deposition temperature".

In case the curing temperature of the coating layer is within the temperature range down to a temperature value by 10° C. lower than "compatibility temperature—non-compatibility temperature" or "compatibility temperature—liquid crystal deposition temperature", the mixture solution is oversaturated and compatibility is maintained, and it is necessary that the liquid crystal shows an isotropic phase. If the coating layer is cured within this temperature range, a desirable structure can be obtained, and the liquid crystal can be driven at low voltage, and the information recording medium can be turned to be highly resistant. However, if it is by more than 10° C. lower, the liquid crystal and UV-setting prepolymer may be separated to two layers before curing, and this is not the phase separation condition necessary for performing information recording with good contrast. Specifically, the liquid crystal domain grows too much, and the skin layer is not perfectly formed on the surface of the information recording layer. Bleeding of the liquid crystal liquid may occur or the UV-setting resin is turned to a mat-like condition, and it is difficult to incorporate the information in an accurate manner. Further, a UV-setting type resin may not be able to retain the liquid crystal and the information recording layer may not even be formed in some cases.

If the curing temperature of the coating layer is set within the temperature range up to 10° C. higher than the "compatibility temperature—non-compatibility temperature" or "compatibility temperature—liquid crystal deposition temperature" an image with less granulate noise and constant contrast can be obtained in information recording. Although the detailed reason for this is not known, it may be attributable to the fact that agglutination of the UV-setting resin not yet cured can be adjusted and that slight unevenness of transmittance can be prevented. However, in case it is by more than 10° C. higher, phase separation between the liquid crystal phase and resin phase in the information recording medium becomes indefinite, and efficient light scattering may not occur or the information recording layer may be turned to a low resistance even though the detailed reason is not known.

(6) It is preferable that the film thickness of the information recording layer is 1 to 30 $\mu$m. In general, if the film is thick, the operating voltage becomes higher and better contrast may be provided. If the film is thin, it is possible to have high sensitivity. To have the better sensitivity and the better contrast, the film thickness is preferably 3 to 20 $\mu$m, or more preferably 6 to 15 $\mu$m, and it is possible to have a lower operating voltage while maintaining high contrast.

In the information recording medium of the present invention, spacers such as glass beads used for maintaining gaps may cause noise in the normal type liquid crystal display unit. For this reason, surface smoothness is required in addition to uniformity in the film thickness of the information recording layer. If film thickness is not uniform, the driving voltage changes extensively, and this may cause uneven density or uneven contrast, and the lack of surface smoothness may cause granulate noise.

The electrode layer 13 may be transparent or non-transparent. Metal thin film dielectric film, inorganic metal oxide dielectric film such as indium tin oxide, or organic dielectric film such as quaternary ammonium salt having specific resistance of not more than $10^6$ $\Omega$ cm may be used. The electrode layer is formed by the methods such as vacuum deposition, sputtering, CVD, coating, plating, immersion, electrolytic polymerization, etc. The film thickness must be varied according to electrical characteristics of the material of the electrode and to the voltage applied during information recording. For example, in ITO film, it is about 10 to 300 nm, and it is formed over the entire surface between the electrode and the information recording layer or to match the formation pattern of the information recording layer.

The substrate 15 may be transparent or non-transparent. It supports the information recording medium in the form of a card, film, tape, disk, etc. in terms of strength, and it is not necessarily provided in case the information recording layer has supporting strength. There is no restriction on material and thickness of the substrate so long as it has strength of a certain degree enough to support the information recording layer. For example, flexible plastic film, or a rigid material such as glass, plastic sheet, card, etc. are used. More concretely, in case the information recording medium is in the form of a flexible film, tape, disk, or card, then flexible plastic film is used. If higher strength is required, rigid sheet, glass, etc. are used.

In case information is reproduced under transmitted light, the electrode and the substrate must have transparency. In such case, a layer having an anti-reflective function may be laminated as necessary on the side opposite to the side where the electrode layer of the substrate is provided, and the transparent substrate may be adjusted to have a film thickness to provide an anti-reflective function, or an anti-reflective property may be added by combining both. In case information is reproduced under reflected light, a reflective metal plate may be used as the electrode or a light reflecting layer may be laminated on the substrate surface to provide a reflective property.

Next, a description will be given on the method to record information to the information recording medium.

Information is recorded to the information recording medium of the present invention through a procedure using a photoelectric sensor, heat, laser, corona charging, or information recording using a photoelectric sensor. It is preferable to record information using a photoelectric sensor. There are two types of such photoelectric sensor: The one comprises an electrode layer and a photoconductive layer laminated on a transparent substrate, said photoconductive layer being a single layer type photoconductive layer having both a charge generating function and charge transport function to match the information light. The other is a laminated type, comprising a charge generating layer and a charge transport layer sequentially laminated on an electrode layer. On the photoconductive layer, when light is irradiated on it, optical carriers (electrons and holes) are generated on the irradiated portion, and these carriers can migrate within the width of the layer. The effect is particularly remarkable when an electric field is present. Such photoelectric sensors include the photoelectric sensor disclosed, for example, in Japanese Patent Applications 6-6437, 6-84640, etc. The photoelectric sensors are amplified when light is irradiated on an electric field or electric charge given to the information recording medium. The conductivity is maintained when voltage is continuously applied even after light irradiation is completed, and it has the effect to continuously provide an electric field or electric charge to the information recording medium.

FIG. 2 shows an information recording apparatus with the photoelectric sensor incorporated in it. In the figure, reference numeral 1 represents a photoelectric sensor, 3 represents an information recording medium, 13' represents a photoelectric sensor electrode, 14 a photoconductive layer, 11 an information recording layer, 13 an information recording medium electrode, 15 a substrate, 19 a spacer, 21 a light source, 22 a shutter, 23 a pulse generator (power source), and 24 represents a black box.

By the pulse generator 23, voltage is applied between the electrodes 13 and 13'. When information light is irradiated from the light source 21, the optical carriers generated on the photoconductive layer 14 on the irradiated portion migrate toward the boundary surface closer to the information recording layer 11 by an electric field generated by the two electrodes. Thus, voltage is redistributed, and a liquid crystal phase on the information recording layer 11 is oriented, thereby achieving a recording to match a pattern of the information light. In the figure, the positive electrode is on the photosensitive member side and the negative electrode is on the photosensitive member side, and the negative electrode is on the information recording medium side, while it is needless to say that the polarity is determined according to discharge characteristics of the photoelectric sensor.

In setting the application voltage, voltage distribution to the photoelectric sensor and the information recording medium and to a gap between the two should be properly set, and voltage to be applied to the information recording layer should be set in an operating voltage area because some of the liquid crystal materials may be operated at low voltage. In the information recording by the photoelectric sensor, it is possible to achieve planar analog recording and also to orient the liquid crystal phase by means of electrostatic charge. Thus, high resolution equal to or higher than that of a silver salt photographing method can be obtained, and the image obtained by information exposure can be visualized and retained by orientation of the liquid crystal phase.

As the method to input information to a first information recording medium shown in FIG. 1 (a) of the present invention, the method using a camera or a method of recording by laser are used. In the method using a camera, the information recording medium is used instead of photographic film used on an ordinary type camera. In such a camera, both an optical shutter and electric shutter can be used. Also, by separating optical information into R, G and B components by means of a prism or color filter and by forming one frame from three information recording media or by forming a frame by aligning R, G and B images on a plane, color photographing can be achieved.

In the recording method by laser, an argon laser (514.448 nm), helium-neon laser (633 nm), and semiconductor laser (780 nm, 810 nm, etc.) can be used. Exposure is performed by scanning of the laser corresponding to an image signal, character signal, code signal, and line drawing signal. Analog recording such as recording of an image can be performed by modulating the optical intensity of the laser. Digital recording such as recording of a character, code or line drawing can be performed by on-off control of the laser beam using a dot generator.

Figure 3:
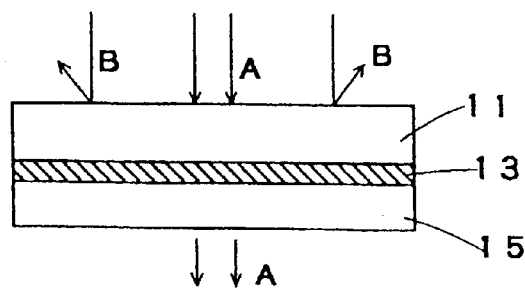
FIG. 3 is a cross-sectional view for explaining the information recording medium of the present invention.

In the electrostatic information recorded on the first information recording medium, when information is reproduced by transmitted light as shown in FIG. 3 immediately after information recording, the liquid crystal is oriented in the direction of the electric field on the information recording unit, and the light A passes through, while, on the portion where information is not recorded, the light B is scattered and this makes contrast with the information recording unit. The information recorded by orientation of the liquid crystal is visual information, which can be read visually under transmitted light. This can be enlarged by a projector and can be read. By reading this using scanning by a laser beam or by transmitted light using CCD, the information can be read at high accuracy. By the use of a Schlieren optical system when necessary, scattered light can be prevented and can be read by reflected light. When contrast becomes an issue, it is desirable to provide a reflecting layer in one of the layers.

After the information has been reproduced, the recorded information on the information recording medium of the present invention is erased as time elapses. Accordingly, the same medium can be repeatedly used, and no special device is required for erasing. In particular, this is effective in case the information recording apparatus is provided with an information reproducing unit and information recording and information reproduction are carried out within a short time in a single apparatus. By adjusting the time of reproduction of the recording, it is possible to reproduce the recorded moving pictures.

Next, description will be given on a second information recording medium of the present invention shown in FIG. 1 (b). The second information recording medium is the same as the first information recording medium except that a photoelectric sensor is incorporated in it. For the information recording, no additional photoelectric sensor is required, and information can be recorded by itself. A photoconductive layer 14 as explained for the photoelectric sensor is provided on the electrode 13', and an information recording layer 11 as explained for the first information recording medium is laminated on the photoconductive layer by the same procedure as described above.

In the second information recording medium, the information recording layer of the present invention can be designed in such manner that no bleeding of the liquid crystal occurs from the surface of the information recording layer. Thus, it is possible to form and deposit the electrode layer 13 directly on the surface of the information recording layer by the sputtering method, and the electrode layer 13 with no conductivity can be formed.

The electrode layer 13 can be designed similarly to the electrode layer of the first information recording medium. Because a skin layer comprising only resin is formed on the surface of the information recording layer, even when ITO film is laminated in thickness of 100 nm by the vacuum deposition method, sputtering method, etc., the layer without cracking can be obtained. Either one or both of the electrode layers 13 and 13' may be transparent. On the electrode layer 13 on the information recording layer, a substrate similar to that of the first information recording medium may be laminated.

In the second information recording medium, a dielectric layer 18 may be arranged between the photoconductive layer 14 and the information recording layer 11 (see FIG. 1(c)). The formation of the dielectric layer is suitable for the case of an organic photosensitive layer, where the photoconductive layer can be formed by coating a photoconductive material and a binder using an organic solvent. By interaction of the photoconductive layer and the information recording layer, it is possible to prevent bleeding of the liquid crystal on the information recording layer and to avoid elution of the photoconductive material by the solvent for forming the information recording layer, causing unevenness of image.

In forming the dielectric layer, it is essential that it has no compatibility to both the photoconductive layer forming material and the information recording layer forming material. In case it has conductivity, diffusion of space electric charge occurs, and resolution decreases. Therefore, it must have an insulating property. However, the dielectric layer decreases the distribution voltage applied on the information recording layer or aggravates resolution. Thus, it is preferably thin, having thickness of not more than 2 $\mu$m. In designing it thin, problems may arise such as image noise by interaction over time or permeation due to a defect such as a pinhole during laminated coating. Because permeability varies according to the ratio of solid matter in the material to be coated, type and viscosity of solvent, the film thickness is properly set for the material to be laminated and coated. To avoid these problems, the following materials may be laminated. Further, if voltage distribution to the layers is taken into account, it is preferable to design in thin film and to have a material with high dielectric constant.

The dielectric layer as described above may be laminated and produced by laminating inorganic materials such as $SiO_2$, $TiO_2$, $CeO_2$, $Al_2O_3$, $GeO_2$, $Si_3N_4$, AlN, TiN, $MgF_2$, ZnS, etc. by the vacuum deposition method, sputtering method, CVD method, etc. As a water-soluble resin having low compatibility to organic solvent, aqueous solutions of polyvinyl alcohol, aqueous polyurethane, water glass, etc. may be used, and these material may be laminated by a spin coating method, blade coating method, roll coating method, etc. Or, fluororesin with a coating property may be used. In this case, it is dissolved in a fluorine-containing solvent and may be laminated by spin coating method. As the coatable fluororesin, the fluororesin as described in Japanese Patent Application 4-24722 may be preferably used. In selecting a coating type transparent insulating material, it is essential that the solvent does not dissolve the photoconductive layer and that it is not dissolved in a material forming the information recording layer when the information recording layer is coated or it is not dissolved in a solvent when coating.

In case the material is formed in film under a vacuum condition, there is a possibility that it dissolves the photoconductive layer during formation of the film. As the materials to form the film by the vacuum deposition method, polyethylene, polypropylene, poly(monochlorotrifluoroethylene), polytetrafluoroethylene, etc. may be used. As the materials to the form film by the CVD method, polyparaxylylene disclosed in Japanese Patent Application 4-24722 may be used. In case the photoconductive layer is formed by inorganic material and there is no interaction with the information recording layer such as bleeding of the liquid crystal, there is no need to provide a transparent insulating layer.

Although the dielectric layer is suitable for the case where the recorded information is reproduced by transmitted light, when the recorded information is to be reproduced by reflected light, a reflective film comprising a dielectric substance may be laminated instead of the transparent insulating layer. As the reflective film comprising a dielectric substance, a film alternately laminated with a magnesium fluoride layer and a zinc sulfide layer is preferably used. This is desirable because the film has a high dielectric constant.

The information recording and reproducing method to the second information recording medium of the present invention is carried out in the same manner as the case of the first information recording medium. Voltage is applied between the electrodes 13 and 13', and information light is irradiated for a given time. By continuously applying voltage, optical carriers generated on the photoconductive layer 14 where light is irradiated are migrated by the electric field generated by the two electrodes. By redistribution of the voltage, the liquid crystal phase in the information recording layer is oriented, and recording to match the pattern of the information light is performed. Voltage may be applied for a given period of time while irradiating the information light.

The first and the second information recording media of the present invention are cut in the lateral direction of the layers to an appropriate size based on the mode of utilization and used. On the cut-off surface, an internal portion of the information recording layer is exposed, and bleeding of the liquid crystal layer occurs during storage. This bleeding phenomenon hinders accurate information recording at ends of the information recording medium when information is recorded. To prevent this, a resin layer may be coated on the cut-off surface after the information recording medium has been cut into an appropriate shape or a synthetic resin film may be laminated to protect the cut-off surface.

Information reproduction can be performed in the same manner as explained for the first information recording medium.

EXAMPLES

In the following, a description will be given on examples of the invention, where the term "part" means weight part, and "%" means weight %.

Example 1
(Preparation of information recording medium)

On a thoroughly cleaned glass substrate of 1.1 mm in thickness, a film of indium tin oxide (ITO) of 200 nm in thickness was formed by sputtering method, and an electrode layer was obtained. Then, 40 parts of dipentaerythritolhexaacrylate (M-400; Toa Synthetic Chemical Industry Co.; molecular weight/functional group=117) as multifunctional monomer, 2 parts of light curing initiator (2-hydroxy-2-methyl-1-phenylpropane-1-one; Dalocure 1173; Ciba-Geigy), 60 parts of mixed liquid crystal containing smectic liquid crystal (S-6; Merck; isotropic transition temperature 60° C.) by 50% and nematic liquid crystal (E31LV; Merck) by 50%, and 3 parts of fluorine type surface active agent (Florade FC-430; Sumitomo 3M Co.) were uniformly dissolved in 105 parts of xylene, and this mixture solution was coated on the above electrode using a blade coater. This was immediately dried at 50° C. for 3 minutes and was further dried under reduced pressure at 50° C. for 3 minutes. Immediately thereafter, an ultraviolet ray of 500 mJ/cm² was irradiated to form an information recording layer of 6 μm in thickness. Thus, the first information recording medium of the present invention was prepared. Liquid crystal was extracted using thermal ethanol from the cut-off surface of the information recording layer of the information recording medium thus obtained. This was dried and examined under scanning electron microscope (S-800; Hitachi, Ltd.) in 10000× magnification. The surface of the information recording layer was covered with a UV-setting resin of 0.6 μm in thickness and resin particles of 0.1 μm in particle size were filled inside the layer.

(Preparation of photoelectric sensor)

Pigment dispersion solution DPDD-3 (Dainichi Seika Kogyo K.K.) containing disazo pigment having photoconductivity was turned to a solution having solid matter by 2% by the use of mixed solvent containing 1,4-dioxane and cyclohexanone (1:1) This was coated on the ITO film side of a glass substrate having ITO film of 50 nm in thickness and 80 Ω/□ in resistance value using a blade coater set at a spacing of 50 μm. This was dried at 100° C. for one hour, and a charge generating layer of 0.3 μm in thickness was laminated.

A charge transport agent solution DPDT-3 (Dainichi Seika Kogyo K.K.) containing a charge transport agent was turned to a solution having solid matter by 9% using a mixed solvent containing 1,1,2-trichloroethane and dichloroethane (3:2), and this was coated on the charge generating layer using a blade coater. Then, this was dried at 80° C. for 2 hours, and a charge transport layer was laminated to obtain a photoelectric sensor having a photoconductive layer of 12 μm in thickness, which comprises a charge generating layer and charge transport layer.

(Information recording and information reproduction)

The photoelectric sensor thus obtained and the information recording medium were placed face-to-face to each other using polyethylene terephthalate film as a spacer, and this was assembled on a recording apparatus of FIG. 2. Using a gray scale having gradation density of 20 steps from the side of the photoelectric sensor (reflection density 0.05 to 1.95 as 0.1 step) as an object, and information recording was performed by applying DC voltage of 650 V for 30 ms with the photoelectric sensor as the positive side and the information recording medium as the negative side. After the information has been recorded, the information recording medium was taken out immediately and was mounted on an image reader. An optical image was formed on a CCD line sensor and was read. The gray scale of 20 steps could be read with good reproducibility. Transmittance (400 nm) on the unexposed portion was 5% and transmittance (400 nm) on the exposed portion was 90%, showing good contrast ratio. The recorded information disappeared gradually and was completely erased after 2 hours without leaving a residual image. When information recording was performed again on the same site of the same information recording medium, no deterioration of image was noted, and the image could be easily recorded and reproduced by as many times as desired using the same information recording medium.

Using a camera for exposure, the photoelectric sensor and the information recording medium were arranged in the same manner as above instead of film. While applying a voltage of 800 V, photographing was performed without auxiliary light under outdoor conditions at daytime with an exposure of f=1.4 and a shutter speed of 1/60 second. When the information recording medium was taken out after exposure, a noiseless image with gradation could be confirmed. This information recording medium was read by a scanner using a CCD line sensor and was printed by a sublimation transfer type printer. A printed image having good gradation and high resolution could be obtained. In this case again, the recorded information could be completely erased without leaving a residual image. Image could be recorded easily using the same information recording medium by as many times as desired.

Example 2

(Preparation of the information recording medium)

An information recording medium was prepared by the same procedure as in Example 1, except that 60 parts of a mixed liquid crystal containing smectic liquid crystal (S-6; Merck; isotropic phase transition temperature 60° C.) by 5% and nematic liquid crystal (E31LV) by 95% were used as liquid crystal material. Liquid crystal was extracted from the cut-off surface of the information recording layer of the information recording medium obtained above by the same manner as in Example 1. By examining the liquid crystal, the same structure as in Example 1 was observed.

(Information recording and information reproduction)

A photoelectric sensor obtained by the same procedure as in Example 1 and the information recording medium were placed face-to-face to each other using polyethylene terephthalate film of 10 μm as a spacer, and this was incorporated in the recording apparatus of FIG. 2. Under exposure using a gray scale having a gradation density of 20 steps from the photoelectric sensor side (reflective density 0.05 to 1.95; 0.1 step) as an object, image recording was performed by applying DC voltage of 400 V for 30 ms with the photoelectric sensor on the positive side and the information recording medium on the negative side. Immediately after the image recording, the information recording medium was taken out and was mounted on an image reader. The optical image was formed on a CCD line sensor and was read. The gray scale of 20 steps could be read with good reproducibility. Transmittance (400 nm) on unexposed portion was 6%, and transmittance (400 nm) on exposed portion was 80%, showing good contrast ratio.

The recorded information disappeared gradually, and it was completely erased without leaving residual image after 5 minutes of the recording. When information recording was performed again at the same site of the same information recording medium, no deterioration of image was noted, and the image could be recorded and reproduced easily using the same information recording medium by as many times as desired.

Example 3

(Preparation of the information recording medium)

An information recording medium was prepared by the same procedure as in Example 1, except that 60 parts of a mixed liquid crystal containing smectic liquid crystal (S-6; Merck; isotropic phase transition temperature 60° C.) by 70% and nematic liquid crystal (E31LV; Merck) by 30% was used as a liquid crystal material. Liquid crystal was extracted from the cut-off surface of the information recording layer of the information recording medium thus obtained in the same manner as in Example 1 and was examined. The same structure as found in Example 1 was observed.

(Information recording and information reproduction)

The photoelectric sensor obtained by the same procedure as in Example 1 and the information recording medium were placed under exposure as in Example 2, and image recording was performed by applying DC voltage of 700 V for 30 ms with the photoelectric sensor on the positive side and the information recording medium on the negative side. Immediately after the image recording, the information recording medium was taken out and was mounted on an image reader. The optical image was formed on a CCD line sensor and was read. The gray scale of 20 steps could be read with good reproducibility. Transmittance (400 nm) on an unexposed portion was 5%, and transmittance (400 nm) on an exposed portion was 90%, showing good contrast ratio.

The recorded information disappeared gradually and was completely erased without leaving a residual image after 48 hours of the recording. The time required for erasing was longer than in Example 1. When information recording was performed at the same site of the same information recording medium, no deterioration of image was noted, and the image could be recorded and reproduced using the same information recording medium by as many times as desired.

Example 4

(Preparation of the information recording medium)

A pigment dispersion solution DPDD-3 (Dainichi Seika Kogyo K.K.) containing disazo pigment having photoconductivity was turned to a solution having solid matter of 2% using a mixed solvent containing 1,4-dioxane and cyclohexanone (1:1). This was coated on the ITO side of a glass substrate having ITO film of 50 nm in thickness and 80 Ω/□ in resistance value using a blade coater set at a spacing of 50 μm. After drying at 100° C. for one hour, a charge generating layer of 0.3 μm in thickness was laminated.

A charge transport agent solution DPDT-3 (Dainichi Seika Kogyo K.K) containing a charge transport agent was turned to a solution having solid matter of 9% using a mixed solvent containing 1,1,2-trichloroethane and dichloromethane (3:2), and this was coated on the charge generating layer using a blade coater. After drying at 80° C. for 2 hours, a charge transport layer was laminated, and a photoconductive layer of 12 μm in thickness comprising a charge generating layer and a charge transport layer was provided.

Further, fluorine-containing resin (Saitop; Asahi Glass) was dissolved in perfluoro (2-butyltetrahydrofuran), and 4.5% solution of it was coated on the photoconductive layer using a spinner at 1800 rpm for 20 seconds. After drying at 80° C. for one hour, a dielectric layer of 0.8 μm in thickness was prepared.

Further, 40 parts of dipentaerythritol hexaacrylate (M-400; Toa Synthetic Chemical Industry Co.; molecular weight/functional group=117) as multifunctional monomer, 2 parts of 2-hydroxy-2-methyl-1-phenylpropane-1-one (Dalocure 1173; Ciba-Geigy), and 60 parts of mixed liquid crystal containing smectic liquid crystal (S-6; Merck; isotropic phase transition temperature 60° C.) by 50% and nematic liquid crystal (E31LV; Merck) by 50%, and 3 parts of fluorine type surface active agent (Florade FC-430; Sumitomo 3M Co.) were uniformly dissolved in 105 parts of xylene, and this mixture solution was coated on the dielectric layer using a blade coater. This was immediately dried at 50° C. for 3 minutes and was further dried under reduced pressure at 50° C. for 3 minutes. Immediately thereafter, an ultraviolet ray of 500 mJ/cm$^2$ was irradiated to form an information recording layer of 6 μm in thickness. Thus, the second information recording medium of the present invention was obtained. A liquid crystal was extracted from the cut-off surface of the information recording layer of the information recording medium thus obtained using thermal ethanol. After drying, the internal structure of the liquid crystal was examined using a scanning electron microscope (S-800; Hitachi, Ltd.) in 10000× magnification. As a result, it was found that the surface of the layer was covered with UV-setting resin of 0.6 µm in thickness, and resin particles of 0.1 µm in particle size were filled in the layer.

(Information recording and information reproduction)

Next, the information recording medium thus obtained was placed under exposure as in Example 2, and image recording was performed by applying DC voltage of 400 V for 20 ms with the photoelectric sensor as the positive side and the information recording medium as the negative side. Immediately after information recording, the information recording medium was taken out, and an optical image was formed on a CCD line sensor and was read. The gray scale of 20 steps could be read with good reproducibility.

The recorded information disappeared gradually and was completely erased without leaving residual image after 2 hours. When information recording was performed at the same site on the same information recording medium, no deterioration of image was noted, and the image could be recorded and reproduced using the same information recording medium by as many times as desired.

Using an ordinary type camera for exposure, photographing was performed under outdoor conditions at daytime and exposure f=1.4 and shutter speed of 1/60 second while voltage of 450 V was being applied as described above. Under exposure, the information recording medium was taken out, and a noiseless image with gradation could be observed. This information recording medium was read by a scanner using a CCD line sensor and was printed by a sublimation printer. As a result, a printed image with good gradation and high resolution could be obtained. In this case again, the recorded information was completely erased without leaving a residual image after 2 hours, and an image could be recorded using the same information recording medium by as many times as desired.

As described above, in a liquid crystal phase for recording information by orientation of a liquid crystal contained in the information recording layer, by the use of a mixture, which contains smectic liquid crystal having good memory property and a liquid crystal having lower memory property, the recorded information on the liquid crystal phase can be easily erased as time elapses without relying on special erasing means such as heating, and this makes it possible to repeatedly use the same information recording medium.

We claim:

1. An information recording medium comprising:
   an information recording layer laminated on an electrode, said information recording layer containing a liquid crystal phase for recording information by orientation of the liquid crystal, information recorded in the liquid crystal phase being erased without heating as time elapses, such that the liquid crystal phase can be repeatedly used for information recording; and
   wherein the liquid crystal constituting the information recording layer comprises:
      a liquid crystal phase having a mixed liquid crystal containing a liquid crystal having a nematic property and a liquid crystal having a smectic property in mixed weight ratio of 95/5–30/70, and a resin phase.

2. An information recording apparatus for recording optical information to an information recording medium by information exposure, whereby a photoelectric sensor comprising a photoconductive layer formed on an electrode and an information recording medium according to claim 1 are placed on optical axis with a gap therebetween and are connected with each other so that voltage can be applied on the electrodes.

3. An information recording apparatus according to claim 2, wherein the photoelectric sensor has photo-induced current amplifying effect.

4. An information reproducing unit for reproducing optical information recorded on the information recording medium by an information recording apparatus according to claim 3, said information reproducing unit comprising an image reader and a CCD line sensor, wherein in an information reproducing process, said information recording medium is removed from said information recording apparatus immediately after recording, and mounted on said image reader for reading an optical image formed on said CCD line sensor.

5. An information reproducing unit according to claim 4 for reproducing optical information recorded on the information recording medium, wherein said information reproducing process is repeatedly performed after the information has been recorded.

6. An information recording apparatus according to claim 3, wherein information reproducing process is repeatedly performed after information has been recorded.

7. An information recording apparatus according to claim 2, wherein said information recording apparatus is provided with an information reproducing unit.

8. An information recording apparatus according to claim 7 wherein information reproducing process is repeatedly performed after information has been recorded.

9. An information recording apparatus according to claim 2, wherein information reproducing process is repeatedly performed after information has been recorded.

10. An information recording apparatus comprising a photoconductive layer, a dielectric layer, the information recording medium according to claim 1, and an upper electrode laminated in this order on a lower electrode, and connection is made so that voltage can be applied between the lower electrode and the upper electrode.

11. An information recording apparatus for recording optical information to an information recording medium by information exposure according to claim 10, wherein the photoelectric sensor comprising a lower electrode and the photoconductive layer has photo-induced current amplifying effect.

12. An information reproducing unit for reproducing optical information recorded on the information recording medium by the information recording apparatus according to claim 10, said information reproducing unit comprising an image reader and a CCD line sensor, wherein in an information reproducing process, said information recording medium is removed from said information recording apparatus immediately after recording, and mounted on said image reader for reading an optical image formed on said CCD line sensor.

13. An information reproducing unit according to claim 12 for reproducing optical information recorded on the information recording medium, wherein said information reproducing process is repeatedly performed after the information has been recorded.

14. An information reproducing unit for reproducing optical information recorded on the information recording medium of claim 1 by an information recording apparatus, said information reproducing unit comprising an image reader and a CCD line sensor, wherein in an information reproducing process, said information recording medium is removed from said information recording apparatus immediately after recording, and mounted on said image reader for reading an optical image formed on said CCD line sensor.

15. An information reproducing unit according to claim 14 for reproducing optical information recorded on the information recording medium, wherein said information reproducing process is repeatedly performed after the information has been recorded.

16. An information recording apparatus comprising:

a photoconductive layer;

a dielectric layer;

an information recording layer;

wherein said information recording layer contains a liquid crystal phase for recording information by orientation of the liquid crystal, information recorded in the liquid crystal phase being erased without heating as time elapses, such that the liquid crystal phase can be repeatedly used for information recording; and an upper electrode laminated in this order on a lower electrode;

wherein connection is made such that voltage can be applied between the lower electrode and the upper electrode.

17. An information recording apparatus for recording optical information to an information recording medium by information exposure according to claim 16, wherein the photoelectric sensor comprising a lower electrode and the photoconductive layer has photo-induced current amplifying effect.

* * * * *